United States Patent [19]

Nakagome et al.

[11] Patent Number: 4,949,306

[45] Date of Patent: Aug. 14, 1990

[54] SENSE CIRCUIT AND SEMICONDUCTOR MEMORY HAVING A CURRENT-VOLTAGE CONVERTER CIRCUIT

[75] Inventors: Yoshinobu Nakagome, Albany, Calif.; Masakazu Aoki, Tokorozawa, Japan; Masashi Horiguchi, Kokubunji, Japan; Kiyoo Itoh, Higashikurume, Japan; Shinichi Ikenaga, Koganei, Japan

[73] Assignee: Hitachi, Ltd., Tokyo, Japan

[21] Appl. No.: 201,015

[22] Filed: Jun. 1, 1988

[30] Foreign Application Priority Data

Jun. 19, 1987 [JP] Japan .................. 62-151113

[51] Int. Cl.$^5$ ................................ G11C 7/02
[52] U.S. Cl. .................. 365/189.01; 365/208
[58] Field of Search ............ 365/189, 149, 230, 190, 365/205, 208, 189.01, 230.01

[56] References Cited

U.S. PATENT DOCUMENTS

| 4,150,441 | 4/1979 | Ando | 365/189 |
|---|---|---|---|
| 4,479,202 | 10/1984 | Uchida | 365/190 |
| 4,724,344 | 2/1988 | Watanabe | 365/208 |

OTHER PUBLICATIONS

"A 65 ns CMOS 1Mb Dram", Webb et al., IEEE International Solid-State Circuits Conference, 1986, pp. 262 and 263.

Primary Examiner—James W. Moffitt
Attorney, Agent, or Firm—Kenyon & Kenyon

[57] ABSTRACT

A highly integrated memory features increased reading speed and writing speed. A sense circuit for this memory including a memory cell array having a plurality of memory cells each of which including at least one insulated gate field effect transistor, and a plurality of data lines to which the memory cells are connected. The memory also includes an address selection mechanism which is capable of selecting a memory cell out of a plurality of memory cells and connecting it to the data line. A sense amplifier a mechanism which is connected to the data line and amplifies a voltage according to the data of a memory cell. A common line (input/output line) is connected to the data lines, via a column switch, where the selection depends upon a column address. A main amplifier is connected to the common line (input/output line), and has at least a mechanism for stabilizing the voltage of the common line (input/output line) and an amplifying mechanism.

13 Claims, 6 Drawing Sheets

SENSE CIRCUIT AND SEMICONDUCTOR MEMORY HAVING A CURRENT-VOLTAGE CONVERTER CIRCUIT

BACKGROUND OF THE INVENTION

The present invention relates to a sense circuit which read signals from a semiconductor memory. More specifically, the invention relates to a high-speed and highly stable sense circuit which is adapted to DRAM (dynamic random access memory) and SRAM (static random access memory) that operable at high speeds and that are highly densely integrated.

The conventional sense circuit in a memory is generally constructed as shown in FIG. 1. An improved system thereof has also been discussed in IEEE, International Solid-State Circuits Conference, 1986, pp. 262-263.

The coventional sense circuit is constructed as shown in FIG. 1. Here, the description deals with the sense circuit in a dynamic memory. It should, however, be noted that the sense circuit is constituted in the same manner even in a static memory by substituting the memory cells of the static memory for the memory array and the sense amplifiers.

In FIG. 1, reference numeral 1 denotes a dynamic memory cell array, 2 denotes a CMOS sense amplifier, 3 denotes a column switch, 4 denotes output line having an address signal which turns the gate of the column switch 3 on and off, 5 denotes a decoder for selecting the address, reference numerals 6A and 6B denotes I/O lines (inputs/output lines, common lines) for transmitting the signals, 8 and 20 denote load elemnets that apply potentials to the I/O lines 6A and 6B, 9 and 10 denote load capacitances that are parasitic on the I/O lines 6A and 6B, and reference numeral 12 denotes a voltage amplifier which amplifiers a difference in the siganl votage between the I/O lines 6A and 6B.

In the conventional sense circuit, the loads 20 and 8 are driven by a sense amplifier that serves as a signal source, and a difference in the signal votage that appears across the I/O lines 6A and 6B is amplified by the voltage amplifier 12 into a large voltage difference; i.e., information read by a sense amplifier is amplified and is produced.

SUMMARY OF THE INVENTION

The resent invention have discovered the following problems inherent in the coventional art.

FIG. 2 illustrates the operation waveforms at the time when different kinds of data are to be continuously read out by changing the address in accordance with the conventional art, and wherein symbol $\tau_1$ denotes a time from when the address is changed to when the signal voltages of the I/O lines becomes equal to each other, and symbol $\tau_2$ denotes a time from when the signal voltages of the I/O lines became equal to each other to when a signal output is produce%d by the amplifier 12.

In the conventional memory which is based upon a system for amplifying the voltage amplitudes of the I/O lines, it is required to increase the voltage amplitudes of the I/O lines to be greater than 200 mV. Therefore, different signals are read out requiring an increased period of time (signal delay) $\tau_1$ until voltages of the I/O lines becomes equal to each other; i.e., the data is read out requiring an increased period of time. The time $\tau_1$ is determined by the impedance (parallel resistances of $R_1$ and $R_2$)

$$R = \frac{R_1 R_2}{R_1 + R_2}$$

of the I/O lines and the load capacitance $C_L$ thereof. The wiring resistance and wring capacitance increase with the increase in the degree of integration of memory elements, and the signal delay $\tau_1$ in the I/O lines becomes a serious hindrance against realizing a high-speed memory LSI. For instance, the signal delay $\tau_1$ becomes as great as 70% of the total signal delay $\tau_1 + \tau_2$ through it varies depending upon the magnitude of the operation current.

In reading out different kinds of data, furthermore, signal voltages corresponding to the data read out in the previous time are left on the I/O lines, causing the data of the sense amplifier to be inverted. This makes it difficult to increase the W/L ratio (gate-width to gate-length ratio) of the transistor in the column switch to be greater than the W/L ratio of the transistor in the sense amplifier, presenting a great hindrance against increasing the operation speed and obtaining increased operation margin of the circuit.

Means for increasing the operation speed of the sense circuit of I/O lines has been discussed in the aforementioned literature, IEEE, International Solid-State Circuits Conference, 1986, pp. 262-263. The technique discussed here is to amplify a very small voltage change in the I/O lines, and the voltage gain is as small as 35. In order to obtain a voltage amplitude of 5 volts, therefore, the signal voltages of the I/O lines must be at least about 140 mV. This value is slightly smaller than that of the aforementioned conventional sense circuit but is not much difference therefrom, and does not help greatly improve the delay in the signals.

In order to solve the above-mentioned problem, the present invention employs, as means for amplifying signals, a current-voltage converter mechanism which is equipped with a mechansim for stabilizing the potential of I/O lines that transmit signals and a mechanism which converts a signal current flowing through the I/O lines into a signal voltage.

The current-voltage converter mechansim of the present invention works to stabilize the potential of the I/O lines. Therefore, the potential of the I/O lines remains nearly constant irrespective of data. This makes it possible to greatly reduce the delay until the voltages of the I/O lines become equal to each other at the time when different kinds of data are read out. Furthermore, since the potential difference becomes nearly zero volt across the I/O lines, there is obtained improved operation margin at the time of reading out different kinds of data.

These and other objects and many of the attendant advantages of this invention will be readily appreciated as the same becomes better understood by reference to the following detailed description when considered in connection with the accompanying drawings.

DESCRIPTION OF THE PREFERRED EMBODIMENTS

Embodiments of the invention will now be described in conjunction with the drawings. Though the following embodiments deal with a sense circuit in a dynamic memory, it should be noted that the sense circuit can be constituted in the same manner even in a static memory by employing cells of the static memory in place of the memory array and the sense amplifiers.

Figure 3:
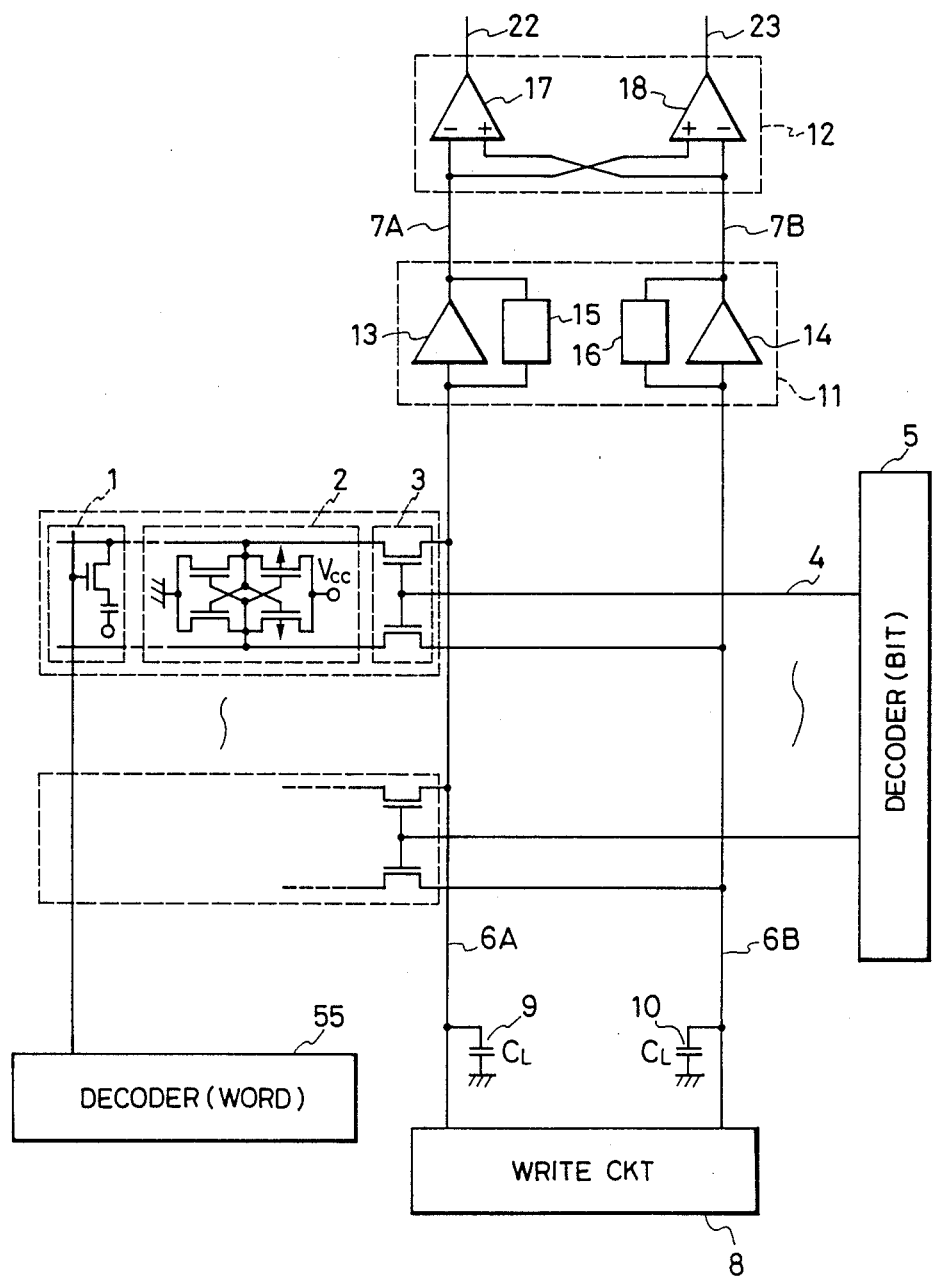
FIG. 3 is a circuit diagram which explains an embodiment of the present invention.

FIG. 3 illustrates an embodiment of the present invention, wherein reference numeral 1 denotes a memory cell array in the dynamic memory, 55 denotes a word line decoder for selecting memory cells of one row in the memory cell array, 2 denotes a sense amplifier for amplifying data that ie read from the memory cell, 3 denotes a column switch which reads data amplified by the sense amplifier onto the I/O line (input/output line, or common data line, or common line) and which writes data from the I/O line onto the memory cell, 5 denotes an address decoder which selects a sense amplifier out of a plurality of sense amplifiers, 4 denotes an output line thereof, 6A and 6B denote I/O lines for transmitting siagnals, reference numerals 9 and 10 denote parasitic capacitances of I/O lines, 88 denotes a write circuit, 11 denotes an I/V converter (current-voltage converter), 13 and 14 denote amplifiers, 15 and 16 denote feedback circuits, 7A and 7B denote outputs of the I/V converter, 12 denotes a voltage amplifier, and reference numerals 17 and 18 denote differential amplifiers.

The operation of the embodiment will now be described in conjunction with the drawings. Data read out from the memory cell is amplified through the sense amplifier 2 which is then connected to the pair of I/O lines 6A and 6B by the column switch 3.

At this moment, the sense amplifer 2 works to pull down either one of the pair of I/O lines to the low voltage side according to data read out from the memory cell. That is, there is established a condition which is equilvalent to the condition where the source of signal current is connected to one of the pair of I/O lines. Then, the I/V converter 11 detects a signal current on the pair of I/O lines, and produces a voltage proportional thereto as designated at 7A and 7B. At the same time, the I/V converter applies a negative feedback from the output side (7A, 7B) to the input side (6A, 6B) through feedback circuits 15 and 16, to stabilize the potential on the I/O lines 6A and 6B.

Figure 1:
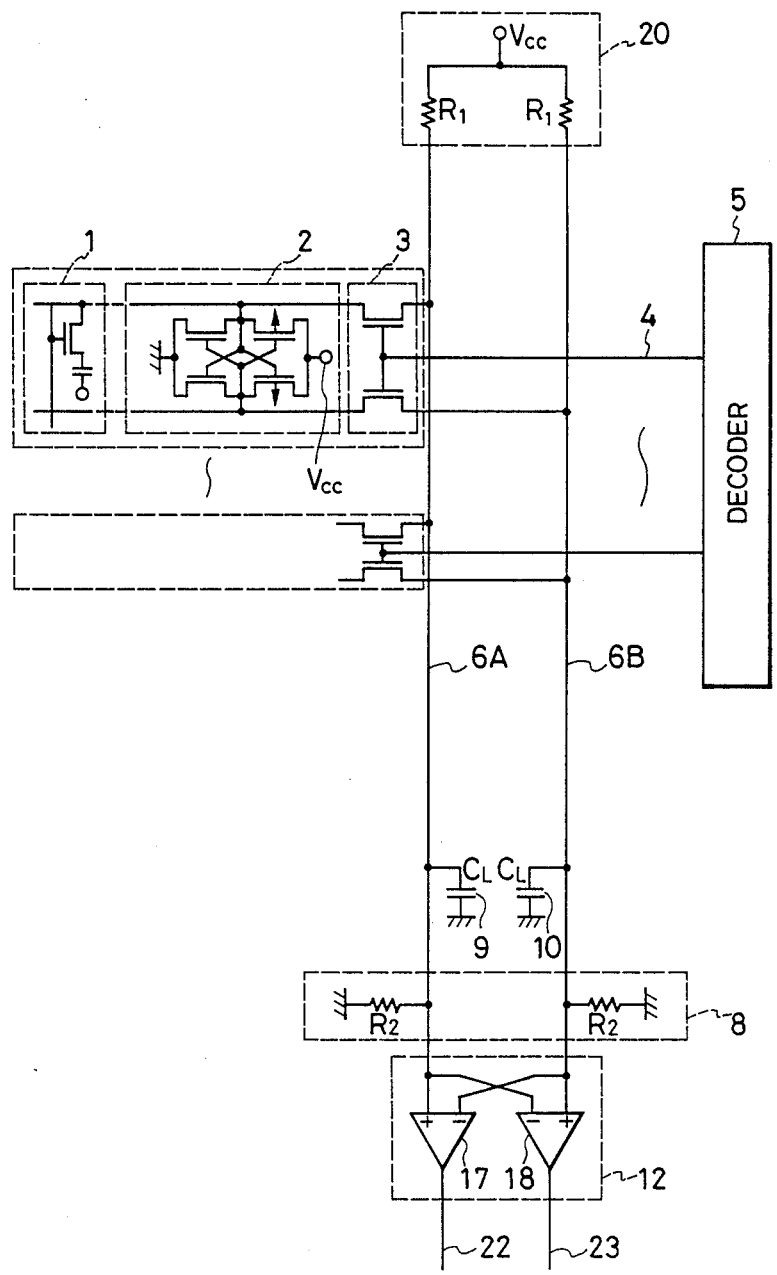
FIG. 1 is a diagram which illustrates a conventional circuit.
Figure 2:
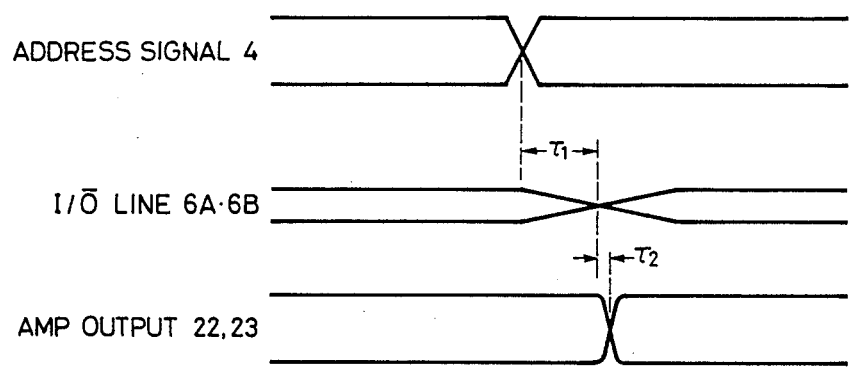
FIG. 2 is a diagram of signal timings for explaining the problem inherent in the prior art.
Figure 4:
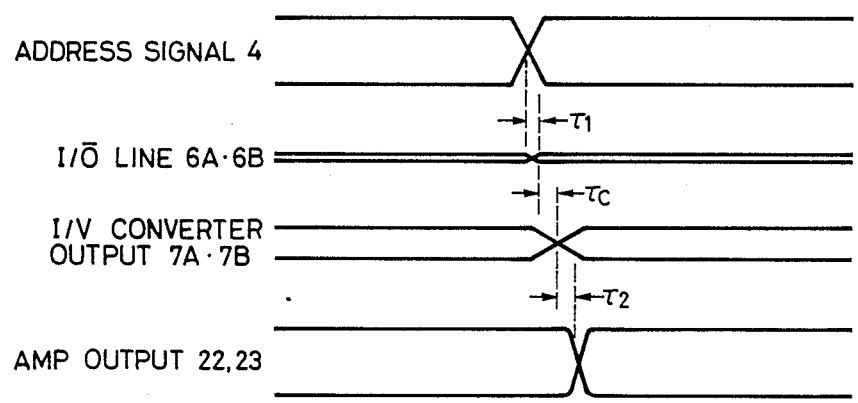
FIG. 4 is a diagram of signal timings for explaning the embodiment of the present invention.

FIG. 4 illustrates waveforms during the operation for reading the signals. Very little potential difference appears on the I/O lines which makes it possible to greatly reduce the time $\tau_1$ required for the potentials of the I/O lines to becomes equal to each other at the time of reading kinds of data. The time $\tau_C$ until the output voltages of the I/V converter become equal is determined by the time which is required for electrically charging of discharging the outputs 7A and 7B of the I/V converter of FIG. 3 by the amplifiers 13 and 14. The load capacitances of outputs 7A and 7B are much smaller than the capacitances of the I/O lines, and the delay time $\tau_C$ is very small. Therefore, the total delay time $\tau_1 + \tau_C + \tau_2$ can be strikingly reduced compared with that of the prior art.

The I/V converter of the present invention will now be described in detail. As mentioned above, the role of the I/V converter is (1) to convert a signal current on the I/O lines into a voltage, and (2) to stabilize the potential of the I/O lines. Embodiments of the I/V converter will now be described.

Embodiment 1 of the I/V converter

Figure 5:
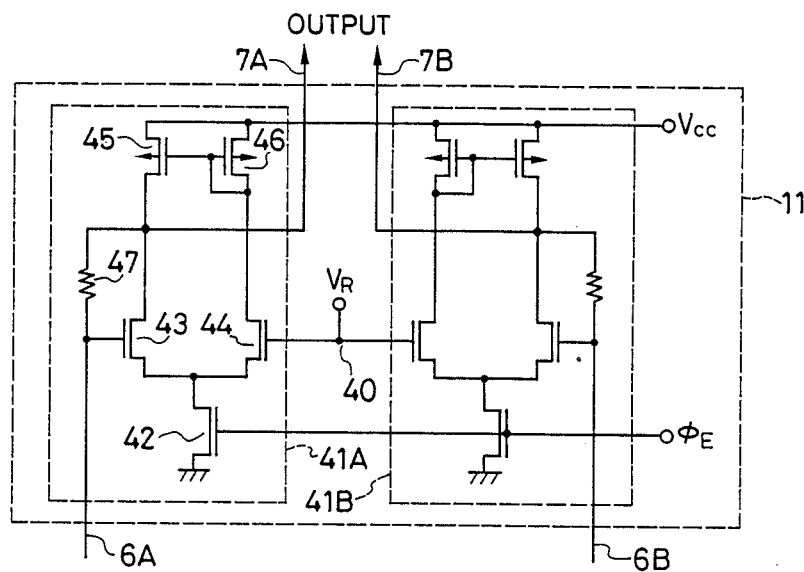
FIGS. 5 to 9 are circuit diagrams which concretely illustrate the current-voltage converter circuits used in the present invention.

FIG. 5 illustrates a first embodiment of the I/V converter, wherein reference numerals 41A and 41B denote I/V converters connected to the I/O lines 6A nad 6B, respectively. Each I/V converter consists of n-channel MIS transistors 42 to 44, p-channel MIS transistors 45 and 46, and a resistor 47. The transistors 42 to 46 consititute a differential amplifier which receives the I/O line 6A and a reference voltage $V_R$ and which produces an output 7A. The differential amplifier corresponds to the amplifier (13, 14) of FIG. 3, and the resistor 47 corresponds to the feedback circuit (15, 16) of FIG. 3.

Operation of this embodiment will now be described. The output signal voltage $v_O$ of the I/V converter is expressed as $$v_O = R_C \cdot i_i$$

where $i_i$ denotes a signal current on the I/O lines, and $R_c$ denotes a resistance of the resistor 47.

By suitably setting the resistance $R_c$, therefore, it is possible to obtain a signal voltage which is proportional to the signal current $i_i$ while maintaining the potential of the I/O lines constant.

Embodiment 2 of the I/V converter

Figure 6:
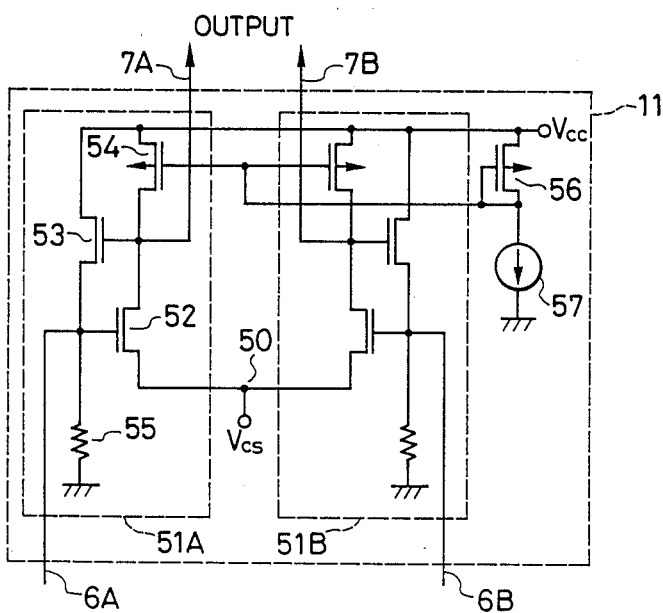

FIG. 6 illustrates a second embodiment of the I/V converter, wherein reference numerals 51A and 51B denote I/V converters that are connected to the I/O lines 6A and 6B, respectively, reference numeral 56 denotes a p-channel MIS transistor, 57 denotes a current source, and wherein the p-channel MIS transistor 56 and the current source 57 constitute a bias circuit for an inverter that is included in the I/V converter. Each I/V converter is constituted by n-channel MIS transistors 52 and 53, a p-channel MIS transistor 54, and a load 55. The n-channel MIS transistor 52 and the p-channel MIS transistor 54 constitute an inverter which receives the I/O line 6A and which produces an output 7A. The n-channel MIS transistor 53 and the load 55 constitute a voltage-controlled current source which is driven by the output of the inverter. The inverter corresponds to the amplifier (13, 14) of FIG. 3, and the voltage-controlled current source corresponds to the feedback circuit (15, 16) of FIG. 3.

Operation of this embodiment will now be described. The inverter is biased so that a predetermined current flows. Therefore, if a potential $V_{CS}$ is given as designated at 50, the voltage 7A is so determined that the potential on the I/O line 6A becomes $V_{CS} + V_{th}(52)$. The voltage V (7A) which is produced is given by, $$V(7A) = V_{CS} + V_{th}(52) + V_{th}(53)$$

where Vth(52) and Vth(53) denote threshold voltages of the n-channel MIS transistors 52 and 53.

Here, if a signal voltage of the I/O line is denoted by $v_i$, a signal current of the I/O line by $i_i$, and an output signal voltage of the I/V converter by $v_O$, then, $$v_o = \frac{1}{g_m} \cdot i_i$$

$$v_i = \frac{1}{g_m \cdot G} \cdot i_i$$

where $g_m$ denotes a transconductance of the transistor 53, and G denotes a voltage gain of the inverter.

Therefore, the voltage amplitude of the I/O line becomes equal to 1/G of the output voltage amplitude. Accordingly, when it is desired to obtain an output voltage amplitude which is greater than 200 mV, the voltage gain G of, for example, about 50 can be easily realized, and the voltage amplitude on the I/O line needs be about 4 mV.

It is therefore possible to stabilize the potential of the I/O lines and, hence, to obtain a signal voltage that is proportional to the signal current of the I/O lines.

Embodiment 3 of the I/V converter

Figure 7:
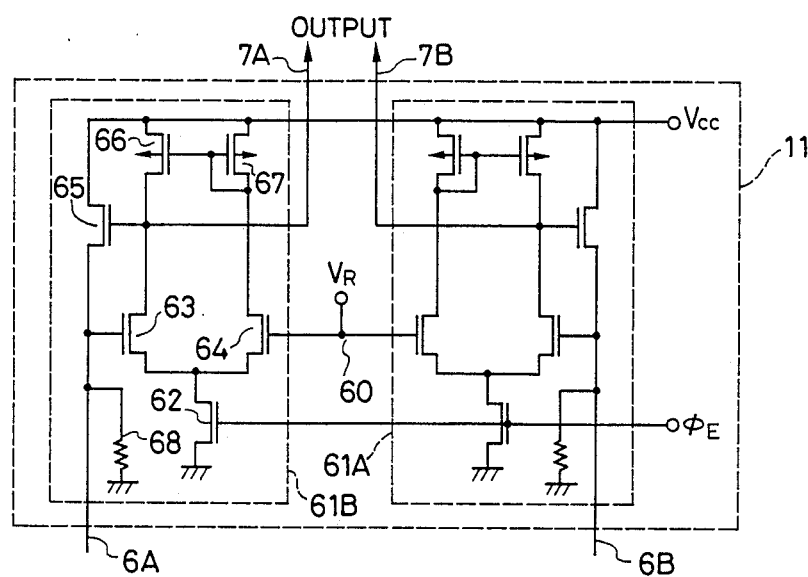

FIG. 7 illustrates a third embodiment of the I/V converter, wherein reference numerals 61A and 61B denote I/V converters that are connected to the I/O lines 6A and 6B, respectively. Each I/V converter is constituted by n-channel MIS transistors 62 to 65, p-channel MIS transistors 66 and 67, and a load 68. The transistors 62, 63, 64, 66 and 67 constitute a differential amplifer that receivers the I/O line 6A and a reference voltage $V_R$ and that produces an output 7A, and the transistor 65 and the load 68 constitute a voltage-controlled current source that is driven by the output of the differential amplifier. The differential amplifier corresponds to the amplifier (13, 14) of FIG. 3 and the voltage-controlled current source corresponds to the feedback circuit (15, 16) of FIG. 3.

According to this embodiment which employs the differential amplifier, the voltage of the I/O line can be set to be equal to the reference voltage $V_R$. That is, the potential of the I/O line can be freely set by controlling the reference voltage $V_R$. Furthermore, there is provided a circuit which features an increased operation margin since the potential of the I/O line remains constant independent of the operation current of the differential amplifier.

Embodiment 4 of the I/O converter

Figure 8:
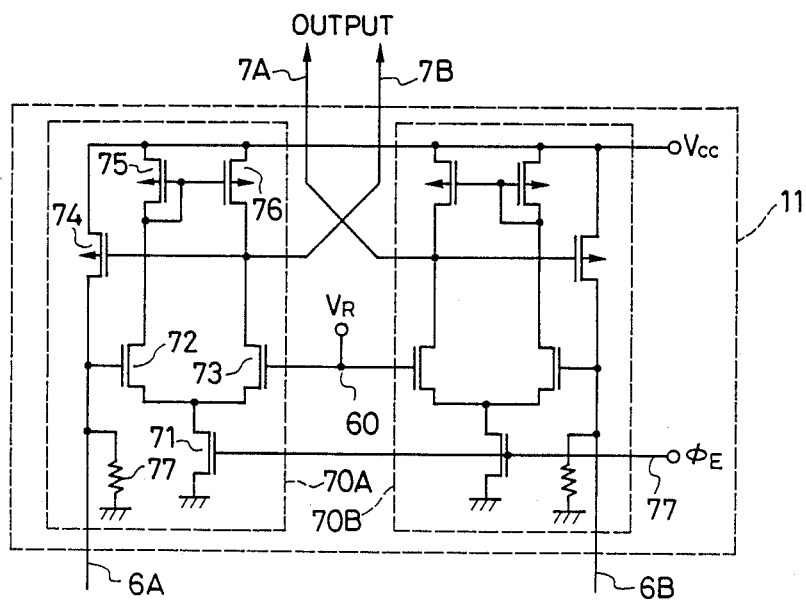

FIG. 8 illustrates a fourth embodiment of the I/V converter, wherein reference numerals 70A and 70B denote I/V converters connected to the I/O lines 6A and 6B, respectively. Each I/V converter is constituted by n-channel MIS transistors 71 to 73, p-channel MIS transistors 74 to 76, and a load 77. The transistors 71, 72, 73, 75 and 76 constitute a differential amplifier which receives the I/O line 6A and the reference voltage $V_R$ and which produces the output 7B, and the transistor 74 and the load 77 constitute a voltage-controlled current source which is driven by the output of the differential amplifier. The differential amplifier corresponds to the amplifier (13, 14) of FIG. 3, and the voltage-controlled current source corresponds to the feedback circuit (15, 16) of FIG. 3.

Since the p-channel MIS transistors are used as a driving element for the voltage-controlled current source unlike the aforementioned embodiments, the I/V converter of this embodiment utilizes the power source very efficiently. That is, since the output voltage of the I/V converter is lower than the I/O-line voltage $V_R$, it is allowed to set the reference voltage $V_R$ to be as great as nearly the power supply voltage $V_{CC}$.

In all of the foregoing embodiments, the negative feedback was applied by using an amplifier of the inverted type (in which the phase is invereted between the input 6A and the output 7A) and a feedback circuit of the non-inverted type (in which the phase is not inverted between the input 7A and the output 6A). The feedback circuit of this embodiment which makes use of the p-channel MIS transistors is of the inverter type. Therefore, the amplifier is constructed in the non-inverted type.

Fifth embodiment of the I/V converter

Figure 9:
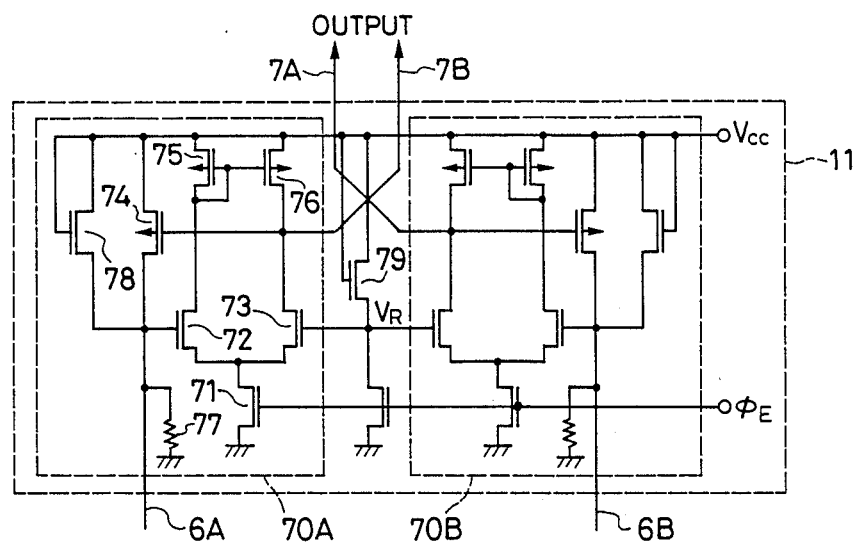

FIG. 9 illustrates a fifth embodiment of the I/V converter, wherein reference numerals 70A and 70B denote I/V converters connected to the I/O lines 6A and 6B. What makes this embodiment different from the foregoing embodiment is the addition of an n-channel MIS transistor 78. In the aforementioned embodiment in which the I/O line is connected to the drain of the p-channel MIS transistor 74, the impedance is so high that response characteristics are deteriorated when a signal current flows in a transient manner. According to this embodiment. on the other hand, an n-channel MIS transistor 78 which is diode-connected is added in parallel with the p-channel MIS transistor 74, in order to lower the impedance of the I/O line and to improve transient response characteristics. Therefore, the I/O line assumes a voltage $V_{CC}-V_{th}$ (Vth denotes a threshold voltage of the n-channel MIS transistor) and whereby the n-channel MIS transistor 79 generates the voltage $V_{CC}-V_{th}$ which is used as the reference voltage $V_R$.

Embodiment of writing the data

Figure 10:
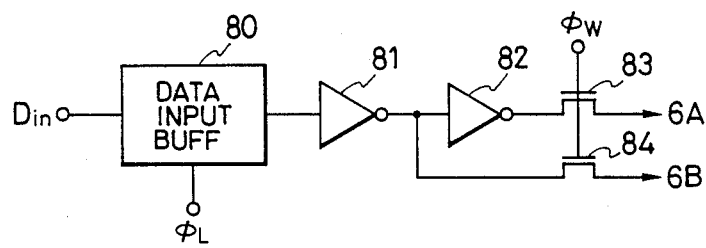
FIG. 10 is a circuit diagram illustrating an embodiment related to the writing of the present invention.
Figure 11:
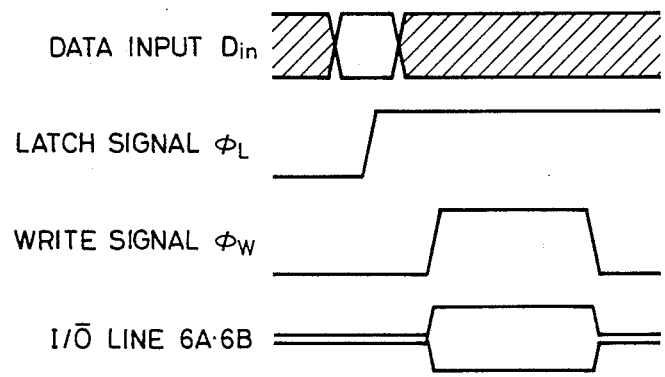
FIG. 11 is a diagram of signal timings to illustrate the embodiment related to the writing of the present invention.

Described below is the operation for writing the data. FIG. 10 illustrates an embodiment of the write circuit (denoted by 8 in FIG. 3) and FIG. 11 illustrates waveforms at each of the portions during the writing operation. In FIG. 10, symbol Din denotes a data input terminal reference numeral 80 denotes a data input buffer, 81 and 82 denote inverters, and reference numerals 83 and 84 denote n-channel MIS transistors that are connected to I/O lines 6A and 6B. The data input through the terminal Din is latched by a data input buffer. The read condition is maintained so far as a write timing signal $\phi_w$ assumes a low potential, and the voltge stabilizing mechanism in the I/V converter works to maintain nearly the same potential on the I/O lines 6A and 6B. When the write timing signal $\phi_w$ assumes a high potential to render the transistors 83 and 84 conductive, the true and complementary signals of the input data are written onto the I/O lines 6A and 6B, respectively. That is, one of the I/O lines 6A and 6B assumes a high potential and the other one assumes a low potential depending upon the input data. The data is written onto a selected memory cell via column switch 3 and data line. When the write timing signal $\phi_w$ assumes a low potential, the potentials on the I/O lines 6A and 6B return to nearly the same value.

During the writing operation, it is desired to stop the operation of the I/V converter from the standpoint of saving the consumption of electric power. For this purpose, the signal of an opposite phase of, for example, the write signal $\phi_w$ should be the one $\phi_E$ in FIG. 5 (or FIG. 7, 8 or 9).

The foregoing embodiments have dealt with the sense circuit of a memory employing complementary MIS transistors. The present invention, however, can also be applied to other sense circuits if they are provided with means for stabilizing the voltage of the I/O lines and means for producing a voltage that is related to the signal current of the I/O lines. For instance, the sense circuits can be constituted in the same manner even when use is made of MIS transistors of a single polarity, bipolar transistors, or a combination thereof, or even when use is made of other circuit systems.

By using MIS transistors for the memory array and bipolar transistors for the sense circuit of I/O lines, in particular, it is allowed to provide a highly densely integrated memory LSI by fully utilizing the element characteristics.

According to the present invention, there is provided a semiconductor memory that operates at high speeds since the delay can be reduced in the sense circuit in the dynamic memory or in the static memory. Furthermore, erroneous operation is prevented from taking place at the time when different kinds of data are read out, and a highly reliable semiconductor memory is provided.

It is further understood by those skilled in the art that the foregoing description deals with preferred embodiments of the disclosed device and that various changes and modifications may be made in the vention without departing from the spirit and scope thereof.

What is claimed is:

1. A semicondcutor memory comprising:
   a memory cell array comprising a plurality of memory cells each of which include at least one insulated gate field effect transistor;
   a plurality of data lines to which the memory cells are connected;
   decoder selecting a memory cell out of a plurality of memory cells and connecting it to the data line associated with the memory cell selected;
   a sense amplifier connected to the data line to amplify a voltage according to the data on a data line connected to the selected memory cell;
   a common line capable of connection to selected one of the plurality of data lines via a column switch selecting ones of the data lines in accordance with a column address; and
   a differential amplifier, connected to the common line, said differential amplifier including means for stabilizing the voltage of the common line and an amplifying mechanism.

2. A sense semiconductor memory according to claim 1, wherein said means for stabilizing the voltage includes a current-voltage converter which receives an electrical signal from the common line as an input.

3. A semiconductor memeory according to claim 2, wherein said current-voltage converter includes a differential amplifier which receives, as the electrical signal of the common line, the voltage of the common line as one input and which receives a voltage from a reference source as another input, and includes a voltage-controlled current drive element which is controlled by the output of said differential amplifier and which supplies a current to the common line.

4. A semiconductor memory according to claim 3, wherein said voltage-controlled current drive element comprises an insulated gate (MIS)transistor.

5. A semiconductor memory according to claim 3, wherein said current-voltage converter includes an inverted-type amplifier which receives the voltage of the common line as an input and a voltage-controlled current drive element which is controlled by an output of said inverted-type amplifier and which supplies a current to the common line.

6. A semiconductor memory according to claim 5, wherein said voltage-controlled current drive element consists of an insluated gate (MIS)transistor.

7. A semiconductor memory comprising:
   a plurality of word lines;
   a plurality of data lines that are provided so as to intersect said word lines at right angles therewith;
   a plurality of memory cells provided at intersecting points of said data lines and said word lines;
   a first decoder selecting one of said plurality of word lines;
   a second decoder selecting one of said plurality of data lines and connecting it to a common line; and
   a current-voltage converter circuit sensing the data of said memory cell read out onto said common line, wherein said current-voltage converter circuit includes a differential amplifier which receives the voltage of the common line as one input and a reference voltage source as another input, said current-voltage converter further including a voltage-controlled current drive element which supplies a current to the common line under the control of the output of said differential amplifier.

8. A semiconductor memory according to claim 7, wherein said voltage-controlled current drive element comprises an insulated gate(MIS)transistor.

9. A semicondcutor memory according to claim 7, wherein said current-voltage converter circuit includes an inverter-type amplifier which receives the voltage of the common line as an input, as well as a voltage-controlled current drive element which supplies a current to the common line under the control of the output of said inverted-type amplifier.

10. A semiconductor memory according to claim 9, wherein said voltage-controlled current drive element consists of an insulated gate(MIS)transistor.

11. A sense circuit in a semiconductor memory that inlcudes a plurality of memory cells, a plurality of pairs of data lines where a pair of data lines is associated with each memory cell, a pair of common lines and a column switch, selectively connecting one pair of data lines to said pair of common lines, comprising:
    a current-voltage converter circuit comprising a pair of amplifiers connected to each common line and receiving as an input an electrical signal from the common line to which it is connected and producing an output signal;
    a pair of feedback circuits, one connected to each amplifier, each feedback circuit stabilizing a voltage on the common line to which its associated amplifier is connected.

12. The sense circuit of claim 11 wherein each of said feedback circuits comprises a voltage controlled current drive element which is responsive to an output of an associated current-voltage converter circuit.

13. The sense circuit of claim 12 wherein each of said current-voltage converters comprises a differential amplifier which receives a voltage of the common line as one input and receives a voltage from a reference source as another input.

* * * * *

UNITED STATES PATENT AND TRADEMARK OFFICE
CERTIFICATE OF CORRECTION

PATENT NO. : 4,949,306  Page 1 of 3
DATED : 14 August 1990
INVENTOR(S) : Y. NAKAGOME et al.

It is certified that error appears in the above-identified patent and that said Letters Patent is hereby corrected as shown below:

| Column | Line | |
|--------|------|---|
| ABS. | 3 | Change "including" to --includes--. |
| ABS. | 10 | After "amplifier" delete "a"; after "mechanism" delete "which". |
| 1 | 9 | Change "read" to --reads--. |
| 1 | 13 | Change "operable" to --operate--. |
| 1 | 29 | After "denotes" insert --an--. (1st occurr.) |
| 1 | 32 | Change "denotes" to --denote--. |
| 1 | 38 | Change "amplifiers" to --amplifies-- |
| 1 | 39 & 42 | Change "votage" to --voltage--. |
| 1 | 50 | Change "resent" to --present--; change "invention" to --inventors--. |
| 1 | 57 | Change "becomes" to --become--. |
| 1 | 60 | Change "proce%d" to --produced--. |
| 2 | 9 | Change "wring" to --wiring--. |
| 2 | 37 | Change "difference" to --different-- |
| 2 | 55 | Before "improved" insert --an--. |
| 3 | 28 | Change "ie" to --is--. |
| 3 | 53 | Change "equilvalent" to --equivalent--. |

UNITED STATES PATENT AND TRADEMARK OFFICE
CERTIFICATE OF CORRECTION

PATENT NO. : 4,949,306

DATED : 14 August 1990

INVENTOR(S) : Y. NAKAGOME et al.

It is certified that error appears in the above-identified patent and that said Letters Patent is hereby corrected as shown below:

| | | |
|---|---|---|
| 3 | 66 | Change "becomes" to --become--. |
| 3 | 67 | Before "kinds" insert --different--. |
| 4 | 1 | Change "of" to --or--. |
| 4 | 32 | Change "$v_O = R_C \cdot ii$" to --$v_O = R_C \cdot i_i$--. |
| 5 | 35 | Change "receivers" to --receives--. |
| 5 | 53 | Change "I/O" to --I/V--. |
| 6 | 7 | After "be as" insert --nearly as--. |
| 6 | 8 | Delete "nearly" |
| 6 | 32 | After "embodiment" change "." to --,--. |
| 6 | 49 | Before "reference" insert --,--. |
| 6 | 55 | Change "voltge" to --voltage--. |
| 7 | 33 | Change "vention" to --invention--. |
| 7 | 42 | Before "decoder" insert --a--. |
| 7 | 48 | Change "one" to --ones--. |

UNITED STATES PATENT AND TRADEMARK OFFICE
CERTIFICATE OF CORRECTION

PATENT NO. :            4,949,306                          Page 3 of 3

DATED :                 14 August 1990

INVENTOR(S) :        Y. NAKAGOME et al.

It is certified that error appears in the above-identified patent and that said Letters Patent is hereby corrected as shown below:

7                  56        Delete "sense".

Signed and Sealed this

Twenty-sixth Day of November, 1991

*Attest:*

HARRY F. MANBECK, JR.

*Attesting Officer*             *Commissioner of Patents and Trademarks*